United States Patent [19]

Carbrey

[11] 4,291,298

[45] Sep. 22, 1981

[54] REVERSIBLE ANALOG TO DIGITAL CONVERTER WITH HIGH PRECISION

[75] Inventor: Robert L. Carbrey, Boulder, Colo.

[73] Assignee: Bell Telephone Laboratories, Incorporated, Murray Hill, N.J.

[21] Appl. No.: 67,780

[22] Filed: Aug. 20, 1979

Related U.S. Application Data

[63] Continuation of Ser. No. 821,241, Aug. 2, 1977, abandoned.

[51] Int. Cl.$^3$ ............................................. H03K 13/02
[52] U.S. Cl. ...................... 340/347 AD; 340/347 DA; 340/347 C; 340/347 M
[58] Field of Search .... 340/347 M, 347 AD, 347 NT, 340/347 C; 179/15 AV

[56] References Cited

U.S. PATENT DOCUMENTS

| | | | |
|---|---|---|---|
| 3,216,002 | 11/1965 | Hoffman | 340/347 C |
| 3,251,052 | 5/1966 | Hoffman et al. | 340/347 C |
| 3,449,741 | 6/1969 | Egerton | 340/347 C |
| 3,626,408 | 12/1971 | Carbrey | 340/347 AD |
| 3,646,548 | 2/1972 | Van Doren | 340/347 AD |
| 3,653,035 | 3/1972 | Carbrey | 340/347 C |
| 3,906,488 | 9/1975 | Suarez-Gartner | 340/347 C |
| 3,935,569 | 1/1976 | Marcel et al. | 340/347 M X |
| 4,072,939 | 2/1978 | Heller et al. | 340/347 AD |

OTHER PUBLICATIONS

The Engineering Staff of Analog Devices, Inc., Analog-Digital Conversion Handbook, 6/1972, pp. II-46 to II-48; II-80 & 81.
Hoeschele, Analog-to-Digital/Digital-to-Analog Conversion Techniques, 8/1968, pp. 416–421.
Suarez et al., All-MOS Charge Redistribution Analog-to-Digital ----, IEEE Journal of Solid State Circuits, 12/1975, vol. S.C. 10, No. 6, pp. 379–385.
Torng, Introduction to the Logical Design of Switching Systems, Addison-Wesley Publishing Co., Inc., 1964, pp. 135–156.

*Primary Examiner*—Thomas J. Sloyan
*Attorney, Agent, or Firm*—Michael A. Morra

[57] ABSTRACT

A reversible analog to digital converter is designed for high precision in the interrelation of analog voltages and binary digital representations. An upper and a lower limit voltage converge on the analog voltage level in binarily decreasing steps. The upper and lower limits are averaged to form a trial voltage; in A/D conversion the trial voltage replaces one of the limits in accordance with a comparison between the analog voltage and the trial voltage, in digital to analog conversion the trial voltage replaces one of the limits in accordance with a binary input signal.

13 Claims, 9 Drawing Figures

REVERSIBLE ANALOG TO DIGITAL CONVERTER WITH HIGH PRECISION

This is a continuation of application Ser. No. 821,241, filed Aug. 2, 1977, now abandoned.

FIELD OF THE INVENTION

This invention relates to digital transmission systems and in particular to circuits for performing analog to digital and digital to analog conversion.

DESCRIPTION OF THE PRIOR ART

Analog to digital (A/D) and digital to analog (D/A) converters interface analog equipment with digital transmission facilities. The criteria of cost and size favor conversion schemes adapted to large scale integration. Charge redistribution converters are among the more adaptable schemes owing to their inherent digital nature; but heretofore have not been capable of high resolution and accuracy.

In one prior art charge redistribution converter, a bootstrapping technique is used in the accumulation of binarily decreasing increments of charge to obtain an approximation of an analog voltage. In this technique, variable stray capacitance between a chip substrate and charge redistribution, components, storage components and coupling capacitors degrade the overall conversion accuracy. The variation in the stray capacitance is a known but largely ignored phenomenon.

In another prior art technique a plurality of capacitors, binarily related in value, are switched in or out of a circuit in accordance with a predetermined process. The overall accuracy of the converter is degraded by the ability to precisely maintain a relative accuracy among many capacitors, each to the others.

Another prior art technique requires only two precision capacitors for charge redistribution but requires $N(N+1)$ charging steps to perform N-bit A/D conversion; here each charging step reduces the net accuracy and the plurality of steps precludes high resolution.

It is therefore an object of this invention to provide a reversible analog to digital converter having high resolution and accuracy.

It is another object of this invention to utilize a charge redistribution technique that is readily adapted to large scale integration.

SUMMARY OF THE INVENTION

In the instant invention, analog voltages and binary digital representations are interrelated by a technique that converges an upper and a lower limit voltage to the level of the analog voltage in binarily decreasing steps defined by the digital representation; this technique, which utilizes only two precision components and requires a minimum number of charging steps, it utilized in both A/D and D/A conversion. More specifically, the upper and lower limit voltages are initially selected to bracket any level that the analog voltage might assume and a trial voltage is obtained by averaging the limit voltages. In D/A conversion one or the other of the limit voltages is changed to the level of the trial voltage in accordance with the binary state of a digital input signal. In A/D conversion the magnitude of the analog voltage and the trial voltage are compared; one or the other of the limit voltages is changed to the level of the trial voltage in accordance with the binary outcome of the comparison.

In accordance with one embodiment of the invention, the trial voltage is generated by redistributing charge between two equal capacitors of precision quality, one capacitor being charged to the level of the upper limit voltage and the other capacitor being charged to the level of the lower limit voltage. A constant current generator responsive to a comparator output signal is thereafter used to adjust the level of one or the other of the limit voltages to the level of the trial voltage. Accuracy in the transfer of voltages is achieved through short term consistency of a comparator circuit rather than through precision components.

In accordance with another embodiment of the invention, the trial voltage is generated as before; but a pair of buffers are used to deliver the trial voltage to upper and lower limit storage capacitors. The buffers utilized are unity gain, zero offset amplifiers having high input impedance. The required precision results from conventional feedback techniques rather than precision components. Hence the only precision components are the equal capacitors used in charge redistribution.

In a third embodiment of the invention, the upper and lower limit storage capacitors are also arranged to perform the redistribution function. In this scheme only two buffers are required but the number of precision components are increased to two pairs of capacitors in D/A conversion and to three pairs in A/D conversion. The precision requirement, however, only extends to accuracy within a particular pair. Additionally, precision in the aforementioned buffers is preserved without the need for precision components by FET source followers having a constant current generator as the quiescent source load to thereby achieve unity gain and zero offset while avoiding certain of the complexities that result from a feedback amplifier.

A fourth embodiment of the invention expands the role of the storage function to not only include upper and lower limit storage means but also a trial voltage storage means. While this notion was introduced in the third embodiment, it is advantageously highlighted here. Storage locations now change in accordance with the particular coding or decoding pattern. The redistribution of charge still requires only two precision components that are now resistors which provide instantaneous averaging and certain additional advantages that flow therefrom.

It is a feature of this invention that A/D and D/A conversion are performed on a most significant bit (MSB) first basis.

It is another feature of this invention that logarithmic and linear operation are possible in both A/D and D/A conversion.

The foregoing and other objects and features of this invention will be fully understood from the following description of the illustrative embodiments taken in conjunction with the accompanying drawings.

DETAILED DESCRIPTION

Figure 1:
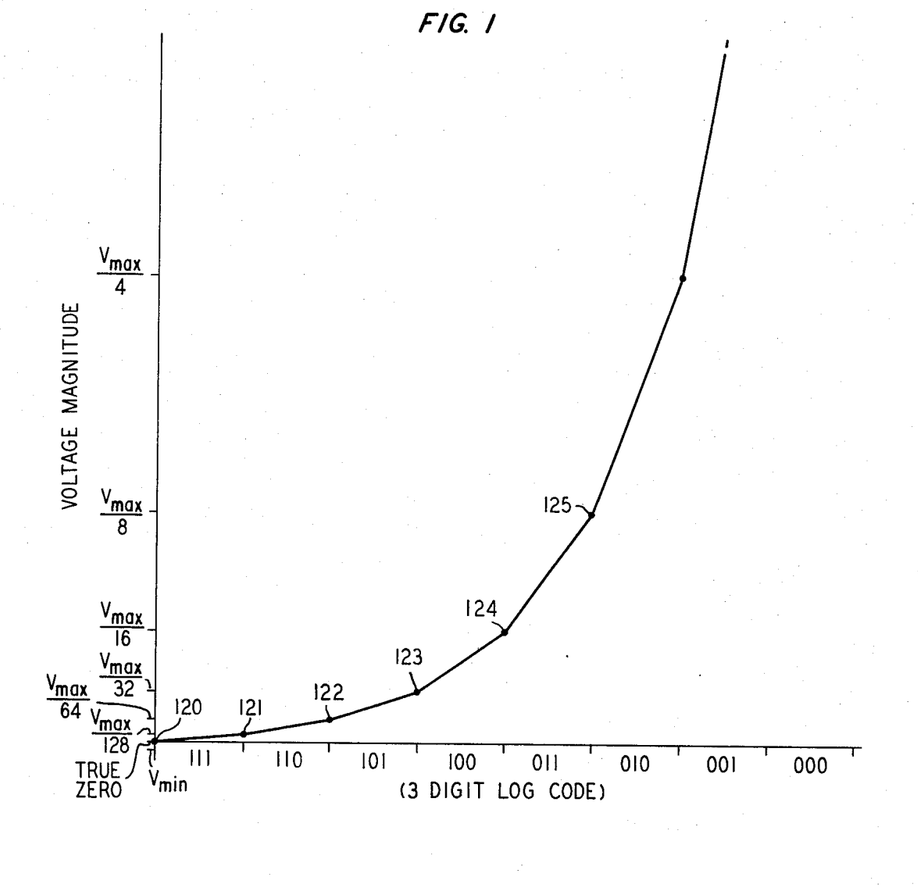
FIG. 1 is a graph of a piecewise linear logarithmic companding characteristic.

FIG. 1 discloses a graph relating the assignment of 3-digit logarithmic codes to voltage magnitudes in accordance with a logarithmic companding characteristic having a total of 16 segments or chords (only the eight segments or chords corresponding to the positive voltage magnitudes are shown). Although 16 segments are identifiable this characteristic is generally referred to as a 15 segment characteristic because a collinear positive and negative segment "touch" and give the appearance of being a single segment. In an A/D conversion example, an analog voltage having a positive polarity between a predetermined maximum voltage ($V_{max}$) and $V_{max}/2$ is assigned a 3-digit code "000". If the magnitude of the analog voltage resides between $V_{max}/16$ and $V_{max}/32$, this corresponds to straight line segment 123–124 and logarithmic code 100 is assigned. The magnitude of the analog voltage however is not sufficiently defined by a segment or chord and greater resolution is desirable.

Figure 2:
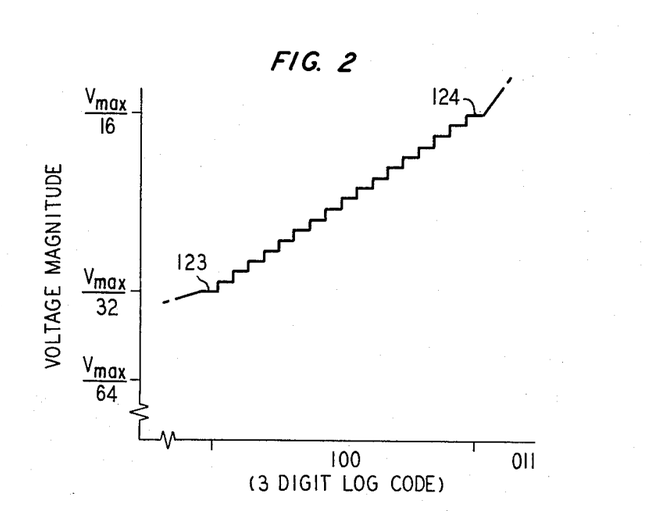
FIG. 2 is an expanded portion of the graph of FIG. 1.

FIG. 2 is an expanded portion of a section of FIG. 1 and illustrates linear coding between points 123 and 124. The analog voltage in this range is linearly resolved into one of 16 equal steps as explained hereinafter. Note in FIG. 1 however that not all steps in the various logarithmic segments are of the same size; the smallest steps occur in logarithmic segment 120–121 where each step has a resolution of one part in $2^{12}$ $$\left( \frac{1}{4096} \text{ of the entire range} \right).$$

Such precision is exceedingly demanding on A/D or D/A converters and is commonly referred to as 12-bit resolution.

Eight binary digits are used for designating analog samples in the 15 segment chord law notation and are designated P ABC wxyz. "P" stands for the polarity bit which defines the polarity of the segment. Binary digits "A, B and C" stand for the three bits which define the chord or segment. There are eight chords or segments for each polarity and the three bits define $2^3$ chords. Binary digits "w, x, y and z" identify the one of sixteen equal parts or steps that span the chord's range.

I. SPLIT DIFFERENCE CODEC

Figure 3:
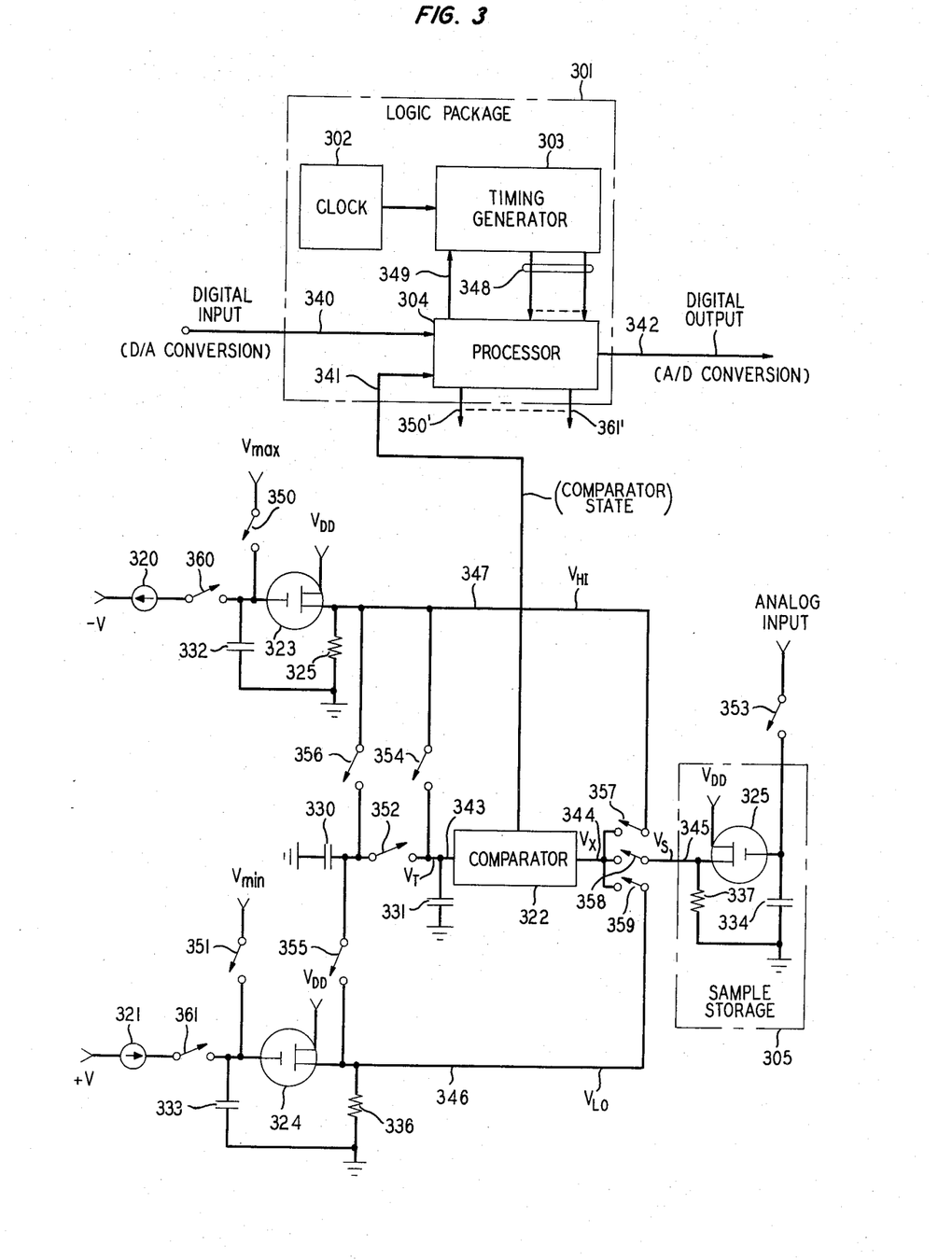
FIG. 3 shows a first illustrative embodiment of the invention and is called a Split Difference Codec.

FIG. 3 discloses a reversible A/D converter capable of logarithmic and linear operation in accordance with the principles of the invention. The combination of logarithmic and linear operation provides an arrangement suitable for companding in piecewise linear segments. Operation as an A/D converter in the logarithmic and linear modes will be first described.

Logic package 301 comprises clock 302, timing generator 303 and processor 304. Clock 302 is a square wave oscillator suitable for driving timing generator 303 which advantageously comprises a binary counter and control logic for generating timing and control signals. A signal having two phases (shown as timing waves $\phi_1$ and $\phi_2$ in FIG. 6) is used to regulate timing. One phase comprises positive pulses derived from the positive going transitions of the square wave output of the clock and the other phase comprises positive pulses derived from the negative going transitions of the clock. The pulses corresponding to the two clock phases do not overlap in time.

A START control signal is periodically generated by timing generator 303 and sets the analog sample rate (8000 samples/second typically). The START signal (shown as timing wave START in FIG. 6) is a positive pulse delivered when the binary counter reaches a predetermined count. Logarithmic coding commences with the START pulse and continues for a maximum of 7 $\phi_2$ pulses.

Figure 4:
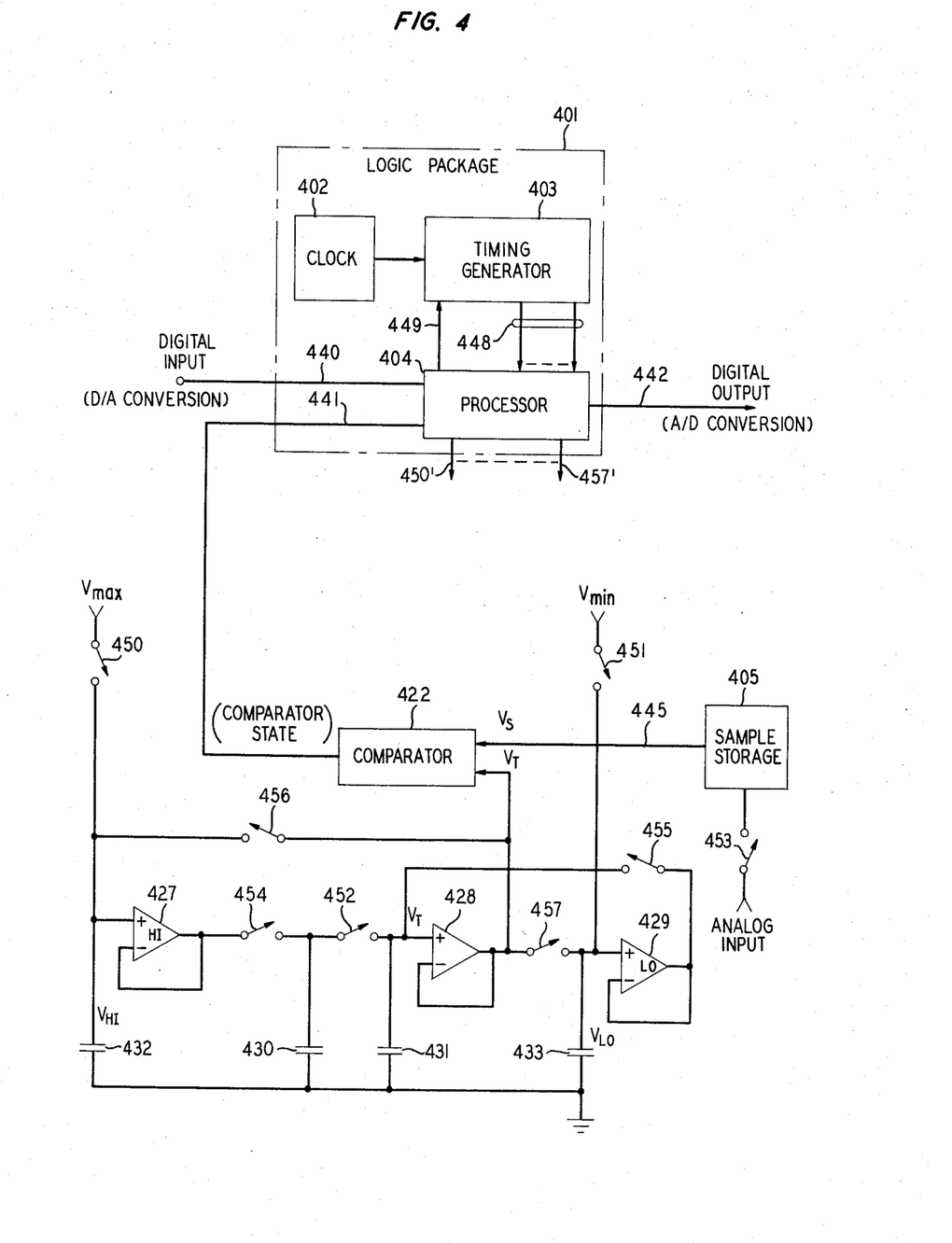
FIG. 4 shows a second illustrative embodiment of the invention and is called a Triple Buffer Codec.

Processor 304 further includes combinatorial logic responsive to timing generator 303 over leads designated 348, the state of comparator 322 on lead 341 and the state of a digital input signal on lead 340 when the converter is in the D/A mode, for energizing leads 350′–361′ to briefly operate switches 350–361 and for delivering a digital output on lead 342 in the A/D mode. Switches are shown in FIGS. 3 and 4 as simple contacts and in FIGS. 5 and 9 as pairs of Field Effect Transistors. The following input/output table describes the switch control portion of processor 304 in the A/D mode for logarithmic and linear operation. Processor 304 is advantageously designed as taught in Chapter 9, pages 135 to 156, of *Introduction to the Logical Design of Switching Systems* by H. C. Torng, published by Addison-Wesley Publishing Company, copyright 1964.

TABLE I

A/D CONVERSION
(LOGARITHMIC OPERATION)

| Timing Generator | | | | Switch Lead States | | | | | | | | | | | |
|---|---|---|---|---|---|---|---|---|---|---|---|---|---|---|---|
| START | $\phi_1$ | $\phi_2$ | Prior Comparator State (measured when $\phi_1 = 1$) | Comparator State $V_T > V_X = 1$ $V_T < V_X = 0$ | 350′ | 351′ | 352′ | 353′ | 354′ | 355′ | 356′ | 357′ | 358′ | 359′ | 360′ | 361′ |
| 1 | 0 | 1 | — | — | 1 | 1 | — | 1 | 0 | 0 | 0 | 0 | 1 | 0 | 0 | 0 |
| 1 | 1 | 0 | — | — | 0 | 0 | 0 | 0 | 1 | 1 | 0 | 0 | 0 | 0 | 0 | 0 |
| 0 | 0 | 1 | — | — | 0 | 0 | 1 | 0 | 0 | 0 | 0 | 1 | 0 | 0 | 0 | 0 |
| 0 | 1 | 0 | 1 | 0 | 0 | 0 | 0 | 0 | 0 | 1 | 0 | 1 | 0 | 0 | 1 | 0 |
| 0 | 1 | 0 | 1 | 1 | 0 | 0 | 0 | 0 | 0 | 1 | 0 | 1 | 0 | 0 | 0 | 0 |
| 0 | 1 | 0 | 0 | 1 | 0 | 0 | 0 | 0 | 0 | 0 | 1 | 0 | 0 | 1 | 0 | 1 |
| 0 | 1 | 0 | 0 | 0 | 0 | 0 | 0 | 0 | 0 | 0 | 1 | 0 | 0 | 1 | 0 | 0 |
| (LINEAR OPERATION) | | | | | | | | | | | | | | | | |
| 0 | 0 | 1 | — | — | 0 | 0 | 1 | 0 | 0 | 0 | 0 | 0 | 1 | 0 | 0 | 0 |

TABLE I-continued
A/D CONVERSION
(LOGARITHMIC OPERATION)

| Timing Generator | | | Prior Comparator State (measured when $\phi_1 = 1$) | Comparator State $V_T > V_X = 1$ $V_T < V_X = 0$ | Switch Lead States | | | | | | | | | | | |
|---|---|---|---|---|---|---|---|---|---|---|---|---|---|---|---|---|
| START | $\phi_1$ | $\phi_2$ | | | 350' | 351' | 352' | 353' | 354' | 355' | 356' | 357' | 358' | 359' | 360' | 361' |
| 0 | 1 | 0 | 1 | 0 | 0 | 0 | 0 | 0 | 0 | 1 | 0 | 1 | 0 | 0 | 1 | 0 |
| 0 | 1 | 0 | 1 | 1 | 0 | 0 | 0 | 0 | 0 | 1 | 0 | 1 | 0 | 0 | 0 | 0 |
| 0 | 1 | 0 | 0 | 1 | 0 | 0 | 0 | 0 | 0 | 0 | 1 | 0 | 0 | 1 | 0 | 1 |
| 0 | 1 | 0 | 0 | 0 | 0 | 0 | 0 | 0 | 0 | 0 | 1 | 0 | 0 | 1 | 0 | 0 |

In accordance with Table I, logarithmic coding commences with the START signal and the $\phi_2$ timing pulse. Switch 353 closes to sample analog input signal $V_S$ (assumed to be positive and of a lesser magnitude than predetermined upper limit voltage $V_{max}$). Sample storage circuit 305 comprises capacitor 334 for temporarily holding analog voltage sample, high input impedance transistor 325 (here shown to be an FET) and resistor 337 forming a conventional source follower circuit with its output on lead 345. Two other source follower circuits are activated at this time also. $V_{max}$ is applied through switch 350 to capacitor 332 for use through the source follower comprising transistor 323 and resistor 325. Switch 351 applies $V_{min}$ (essentially ground) to capacitor 333 for use through the source follower comprising transistor 324 and resistor 336. Thus an initial upper limit voltage ($V_{HI}$) on line 347 and a lower limit voltage ($V_{LO}$) on line 346 are established. Switches 350, 351 and 353 are now opened.

During the START signal, when $\phi_1$ is a logic 1 switch 354 operates to deliver $V_{HI}$ to capacitor 331 and switch 355 operates to deliver $V_{LO}$ to capacitor 3390.

Switches 354 and 355 are thereafter opened. Capacitors 330 and 331 are of precision quality and are equal in value to each other; they are often referred to as the redistributing, averaging, or dividing capacitors. On all subsequent $\phi_2$ timing pulses the charge stored on the capacitors is redistributed by brief closure of switch 352; this results in trial voltage ($V_T$) which is an average voltage because the charge is divided between equal capacitors. $V_T$ appears on input 343 to comparator 322 and $V_X$ ($V_S$ or $V_{HI}$ or $V_{LO}$) appears on input 344 to comparator 322. Output lead 341 of the comparator is a logic 1 when $V_T > V_X$ and a logic 0 otherwise. Processor 304 has a one bit storage, updated during each $\phi_2$ pulse, for storing the state of comparator 322. This signal is referred to as the "prior comparator state". During a $\phi_1$ pulse when the "prior comparator state" is a logic 1, indicating that the trial voltage was greater than the sample voltage, switches 355 and 357 are briefly operated to simultaneously reduce the voltage on capacitor 330 from $V_T$ to $V_{LO}$ and to arrange a comparison between $V_T$ and $V_{HI}$ for the purpose of reducing $V_{HI}$ to the level of $V_T$. The output of comparator 322 will immediately respond to this connection by becoming a logic 0 and according to Table I, lead 360' is energized to thereby close switch 360 which connects constant current generator 320 to capacitor 332 for the purpose of lowering voltage $V_{HI}$ to equality with $V_T$. The final voltage on capacitor 332 renders the source voltage on FET 323 equal to $V_T$. Switch 360 will thereafter be opened in response to the change of comparator state.

Figure 7:
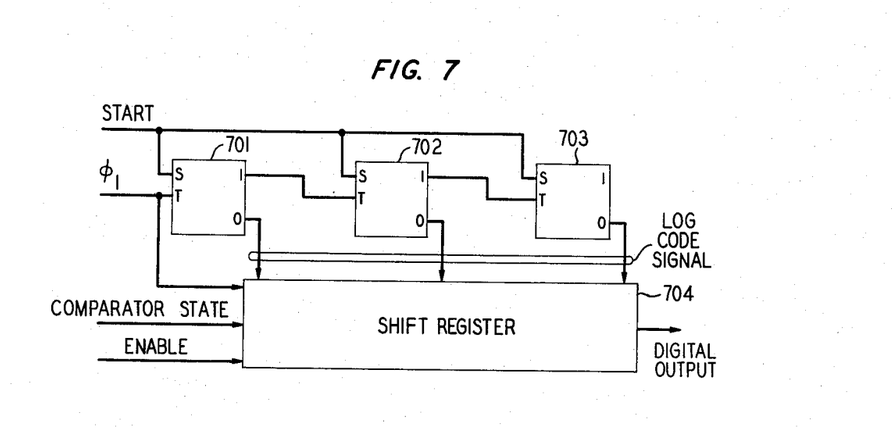
FIG. 7 is an illustrative circuit configuration for generating a logarithmic code signal and entering same into a serial digital output path.

Timing generator 303 is responsive to the eighth $\phi_2$ pulse after the termination of the START signal or to the first $\phi_2$ pulse after the "prior comparator state" signal on input lead 349 has become a logic 0 for changing the state of an ENABLE control signal from logic 0 to logic 1. FIG. 7 illustrates a portion of processor 304 that delivers a digital output signal. During logarithmic coding, binary cells 701, 702 and 703 count the number of $\phi_1$ timing pulses subsequent to the START signal. The positive going transition of the ENABLE signal initiates the transfer of the states of the binary cells into shift register 704. The logic 1 state of the ENABLE signal gates $\phi_1$ pulses and the output states of the comparator (available on lead 341 in FIG. 3) into shift register 704. Parallel to serial conversion is thus performed on the log code signal; further, the comparator states (linear code signal) enter the shift register and follow the log code signal in the order of transmission. The ENABLE signal remains in the logic 1 state until the linear code signal has exited.

During the first $\phi_1$ pulse after the 0-1 transition of the ENABLE control signal, switches 356 and 359 are briefly operated to simultaneously increase the voltage on capacitor 330 from $V_T$ to $V_{HI}$ and to arrange a comparison between $V_T$ and $V_{LO}$ for the purpose of raising $V_{LO}$ to the level of $V_T$. The output of comparator 322 will immediately respond to this connection by becoming a logic 1 and according to Table I, lead 361 is energized to thereby close switch 361 which connects constant current generator 321 to capacitor 333 for the purpose of raising voltage $V_{LO}$ to equality with $V_T$. The final voltage on capacitor 333 renders the source voltage on FET 324 equal to $V_T$. Switch 361 will thereafter be opened in response to the change of present comparator state.

The logarithmic segment of FIG. 1, which defines the magnitude of the analog voltage sample, as existing within a particular segment, has been determined. The upper and lower limit voltages of this segment are present on lines 347 and 346 of FIG. 3, and linear coding commences. The $\phi_2$ timing pulse causes switch 352 to briefly close and thereby average the upper and lower limit voltages. Switch 358 is also briefly closed to connect analog sample voltage $V_S$ to comparator 322 for comparison with trial voltage $V_T$.

If $V_T > V_S$ the upper limit voltage is lowered to the value of $V_T$ by briefly closing switches 357 and 360. Constant current generator 320 now lowers the upper limit voltage, under the control of comparator 322, until it is equal to $V_T$. Simultaneously, switch 355 is closed to lower the voltage on capacitor 330 from its present voltage $V_T$ to the former lower limit value. When $V_{HI}$ has been lowered to the level of $V_T$, the state of comparator 322 changes and switch 360 opens.

If $V_T<V_S$ the lower limit voltage is raised to the value of $V_T$ by briefly closing switches 359 and 361. Constant current generator 321 now raises the lower limit voltage, under the control of comparator 322, until it is equal to $V_T$. Simultaneously, switch 356 is closed to raise the voltage on capacitor 330 from its present voltage $V_T$ to the former upper limit value. When the comparison is achieved, switch 361 opens. This linear process continues a total of four times with the upper or the lower limit voltage being replaced by the trial voltage.

In connection with the prior discussion of processor 304, the digital output signal is a serial combination of log and linear code signals. The digital output signal is transmitted on a most significant bit (MSB) first basis which is typical of sequential A/D conversion. It is an advantageous feature of this invention that it provides MSB first sequential D/A conversion.

In D/A conversion the three binary digits representing the particular logarithmic segment within which the analog voltage level resides are sequentially delivered on a MSB first basis to processor 304 on digital input lead 340. A simple algorithm is employed wherein the upper limit is generated in a number of divisions equal to the binary digit number and the lower limit is generated on the next division. If, for example, the logarithmic code is "101" then the upper limit voltage is generated in five voltage divisions and the lower limit voltage is generated in the following or sixth division. A redistribution control signal is generated in accordance with FIG. 6 to convert the received digital input signal into a sequence of voltage division steps. Here the logarithmic code 101 is converted into the sequence 11111 which is followed by a logic 0 to set the lower limit voltage. The received linear code 1100 is unchanged as between the digital input signal and the redistribution control signal. Table II sets forth the operation of processor 304 as it operates to energize switch leads 350'–361' in D/A operation. It is virtually identical to A/D operation with the exceptions that the redistribution control signal replaces the "prior comparator state" signal, switch leads 353' and 358' are never energized because analog voltages are not sampled in D/A conversion.

and $V_{LO}$ during the coincidence of the START pulse and the $\phi_1$ timing signal in accordance with Table II. Thereafter switch 352 is closed briefly to redistribute the charge between capacitors 330 and 331 to form a trial voltage $$V_T = \frac{V_{max} + V_{min}}{2}.$$

As we are dealing with positive analog voltage samples, $V_{max}$ is chosen to be of greater positive magnitude than any sample voltage and $V_{min}$ is a reference voltage level, selected to be negative with respect to a "true zero" voltage by an amount equal to the eighth chord range $$\left(\frac{V_{max}}{256} \text{ in this example case}\right).$$

This selection is required to set the bottom of the eighth (lowest) chord range at true zero in accordance with FIG. 1. The trial voltage level $V_T$ is used to reduce the upper limit voltage; accordingly switches 357 and 360 are briefly closed and constant current generator 320 lowers the voltage on capacitor 332 until the output of comparator 322 indicates that $V_{HI}$ has been lowered to the level of $V_T$ and processor 304 opens switch 360. Simultaneous with this operation is the discharge of capacitor 330 to the lower limit voltage by the closure of switch 355. Thereafter switch 355 is opened. This process continues a number of times equal to the binary digit number input to processor 304 to establish the upper limit voltage. For example, the digit "101" results in five divisions to reduce the upper limit to $$\frac{V_{max} + V_{min}}{32}.$$

Thereafter one more division is required to determine the lower limit voltage of the logarithmic segment. After the sixth division establishes a new value for $V_T$,

TABLE II

D/A CONVERSION
(LOGARITHMIC OPERATION)

| Timing Generator | | | Comparator State | | Switch Lead States | | | | | | | | | | | |
|---|---|---|---|---|---|---|---|---|---|---|---|---|---|---|---|---|
| | | | Redistribution | $V_T > V_X = 1$ | | | | | | | | | | | | |
| START | $\phi_1$ | $\phi_2$ | Control | $V_T < V_X = 0$ | 350' | 351' | 352' | 353' | 354' | 355' | 356' | 357' | 358' | 359' | 360' | 361' |
| 1 | 0 | 1 | — | — | 1 | 1 | — | 0 | 0 | 0 | 0 | 0 | 0 | 0 | 0 | 0 |
| 1 | 1 | 0 | — | — | 0 | 0 | 0 | — | 1 | 1 | 0 | 0 | 0 | 0 | 0 | 0 |
| 0 | 0 | 1 | — | — | 0 | 0 | 1 | — | 0 | 0 | 0 | 0 | 0 | 0 | 0 | 0 |
| 0 | 1 | 0 | 1 | 0 | 0 | 0 | 0 | — | 0 | 1 | 0 | 1 | 0 | 0 | 1 | 0 |
| 0 | 1 | 0 | 1 | 1 | 0 | 0 | 0 | — | 0 | 1 | 0 | 1 | 0 | 0 | 0 | 0 |
| 0 | 1 | 0 | 0 | 1 | 0 | 0 | 0 | — | 0 | 0 | 1 | 0 | 0 | 1 | 0 | 1 |
| 0 | 1 | 0 | 0 | 0 | 0 | 0 | 0 | — | 0 | 0 | 1 | 0 | 0 | 1 | 0 | 0 |
| | | | | | | | (LINEAR OPERATION) | | | | | | | | | |
| 0 | 0 | 1 | — | — | 0 | 0 | 1 | — | 0 | 0 | 0 | 0 | 0 | 0 | 0 | 0 |
| 0 | 1 | 0 | 1 | 0 | 0 | 0 | 0 | — | 0 | 1 | 0 | 1 | 0 | 0 | 1 | 0 |
| 0 | 1 | 0 | 1 | 1 | 0 | 0 | 0 | — | 0 | 1 | 0 | 1 | 0 | 0 | 0 | 0 |
| 0 | 1 | 0 | 0 | 1 | 0 | 0 | 0 | — | 0 | 0 | 1 | 0 | 0 | 1 | 0 | 1 |
| 0 | 1 | 0 | 0 | 0 | 0 | 0 | 0 | — | 0 | 0 | 1 | 0 | 0 | 1 | 0 | 0 |

Logarithmic operation of the circuit of FIG. 3 commences with a START pulse derived by timing generator 303 from the digital input signal. Switches 350 and 351 are closed briefly to charge capacitor 332 to $V_{max}$ and capacitor 333 to $V_{min}$. Switches 354 and 355 are closed briefly to charge capacitors 331 and 330 to $V_{HI}$ $$\frac{V_{max} + V_{min}}{64},$$

this value is stored as $V_{LO}$ by operating switches 359 and 361. Constant current generator 321 causes the voltage on capacitor 333 to increase until $V_{LO}$ has been raised to the level of $V_T$ at which switch 361 opens. Simultaneously, $V_{HI}$ has been impressed on capacitor 330 by the brief closure of switch 356. Logarithmic decoding is now completed, the analog voltage resides between the newly established upper and lower limits and linear decoding may now commence.

Sequential linear decoding of the binary digits defining the step proceeds in accordance with Table II, virtually identical to Table I and discussed in connection with the coding operation. Whereas in the coding operation upper or lower limit voltages were lowered or raised to the level of $V_T$ in accordance with the output state of comparator 322, in the decoding operation the upper or lower limits are lowered or raised to the level of $V_T$ in accordance with binary states of the redistribution control signal derived from the digital input signal. After the last binary digit is received and the limits appropriately adjusted a final averaging of the upper and lower limits is performed and the voltage $V_T$, on capacitor 331, is the end product of D/A conversion.

II. TRIPLE BUFFER CODEC

FIG. 4 discloses a triple buffer reversible A/D converter capable of logarithmic and linear operation in accordance with the principles of the invention. Buffers 427, 428 and 429 are unity gain, zero voltage offset amplifiers having relatively high input impedance and relatively low output impedance. These amplifiers have a precision that results from conventional feedback techniques rather than from precision components. Sample storage 405, comparator 422 and logic package 401 are functional equivalents of their FIG. 3 counterparts. Processor 404 utilizes the comparator state on input lead 441 in conjunction with timing and control signals on input leads designated 448 to energize leads 450'-457', thereby operating switches 450-457, and to sequentially gate out digits, corresponding to the logarithmic and linear codes, on line 442.

Analog input voltage $V_S$ is sampled by closing switch 453 long enough for sample storage 405 to charge an internal capacitor. This sample voltage is then made available to comparator 422 over input 445. At the start of A/D conversion switches 450 and 451 are closed to charge upper limit storage capacitor 432 and lower limit storage capacitor 433 to the maximum and minimum voltage limits $V_{max}$ and $V_{min}$. Switches 450 and 451 are now opened. Switches 454 and 455 are briefly closed to cause the stored upper and lower limit voltages to be delivered by amplifiers 427 and 429 onto redistribution capacitors 430 and 431. These capacitors are equal to each other and are the only components required to be of precision quality as was the case in FIG. 3. Whereas the absolute value of these capacitors is not critical, their relative value (to each other) is.

Logarithmic coding commences in a manner similar to that described in connection with FIG. 3. Switch 452 operates to redistribute the charge on capacitors 430 and 431. The resultant voltage after the first redistribution is $$V_T = \frac{V_{max} + V_{min}}{2}.$$

Switch 452 is opened. Comparator 422 compares voltage $V_T$ with the sample analog voltage $V_S$ and delivers a logic 1 to processor 404 if $V_T > V_S$ and delivers a logic 0 if $V_T < V_S$. During the coding operation when comparator 422 impresses a logic 1 onto line 441 processor 404 causes switch 456 to close briefly thereby substituting $V_T$ for the previous value of the upper limit voltage on capacitor 432. Switch 455 then closes briefly to deliver the existing lower limit onto capacitor 431. This cycle repeats with switch 452 operating to redistribute charge between capacitors 430 and 431 to obtain a new value of $V_T$ to be compared with $V_S$. When, however, the output of comparator 422 is a logic 0, processor 404 causes the value of $V_T$ to be placed on capacitor 433 by closing switch 457. If a logic 0 is not achieved by the seventh redistribution, then on the eighth redistribution, $V_T$ reaches the "true zero" voltage level and the output of comparator 422 becomes a logic 0. All switches are now opened and linear coding may commence since the value of the analog voltage $V_S$ is defined according to FIG. 1 as residing on the logarithmic segment (chord) having as end points an upper limit corresponding to the voltage stored on capacitor 432 and a lower limit corresponding to the voltage stored on capacitor 433. The number of charge redistribution steps occurring before $V_T < V_S$ are counted in a binary counter such as shown in FIG. 7 to determine the logarithmic code to be transmitted.

Linear coding begins with the brief closure of switch 452 to average the voltages $V_{HI}$ and $V_{LO}$ already stored on capacitors 430 and 431. The following algorithm is used during the remaining four steps: if $V_T > V_S$, replace the existing upper limit on capacitor 432 with voltage $V_T$ and reestablish the lower limit on redistribution capacitor 431 by briefly closing switches 456 and 455; if $V_T < V_S$ replace the existing lower limit on capacitor 433 with voltage $V_T$ and reestablish the existing upper limit on redistribution capacitor 430 by briefly closing switches 457 and 454. The repetition of this operation for a total of four times divides any logarithmic segment of FIG. 1 into 16 discrete steps as shown in FIG. 2. Thus the analog voltage is further defined to within one-sixteenth of the segment's range by a 4-digit linear code; that code being the sequence of comparator output states.

In the D/A conversion mode, a redistribution control signal (FIG. 6), derived from binary digits received on line 440, is utilized by processor 404 in addition to the aforementioned comparator state and the timing and control signals in energizing leads 450'-457'. Logarithmic and linear operation are essentially unchanged from the description set forth in Table II.

As was discussed in connection with FIG. 3 a logarithmic code such as "101" indicates that five voltage divisions are required to establish the upper voltage limit and one more is required to establish the lower limit voltage. Initially the upper and lower limits are set to $V_{max}$ and $V_{min}$ by briefly closing switches 450 and 451. Voltage divisions are accomplished by: (i) loading the upper and lower limit voltages stored on capacitors 432 and 433, onto redistribution capacitors 430 and 431 by briefly closing switches 454 and 455; (ii) redistributing the charge on capacitors 430 and 431 by briefly closing switch 452; (iii) replacing upper limit voltage on capacitor 432 with voltage $V_T$ by briefly closing switch 456; (iv) repeating the above steps a number of times as indicated by the logarithmic code; (v) repeat steps (i) and (ii) but in lieu of step (iii) replace the lower limit voltage on capacitor 433 with voltage $V_T$ by briefly closing switch 457.

In linear decoding, the upper and lower limits are periodically averaged and the redistribution control signal indicates whether to deliver the trial voltage $V_T$ to the upper or to the lower limit storage capacitor. More specifically, upper and lower limit voltages $V_{HI}$ and $V_{LO}$ exist on capacitors 430 and 431 at the end of logarithmic decoding and switch 452 closes briefly to average these voltages and thereby form trial voltage $V_T$. When the redistribution control signal is a logic 1, $V_T$ is delivered to capacitor 432 through buffer amplifier 428 and switch 456. When the redistribution control signal is a logic 0, switch 457 closes briefly to deliver trial voltage $V_T$ to capacitor 433 through buffer amplifier 428. This process continues a total of four times as was discussed in connection with FIG. 3. The analog voltage thus derived from the received binary digits is available on capacitor 431.

III. CROSSED DIVIDERS CODEC

Figure 5:
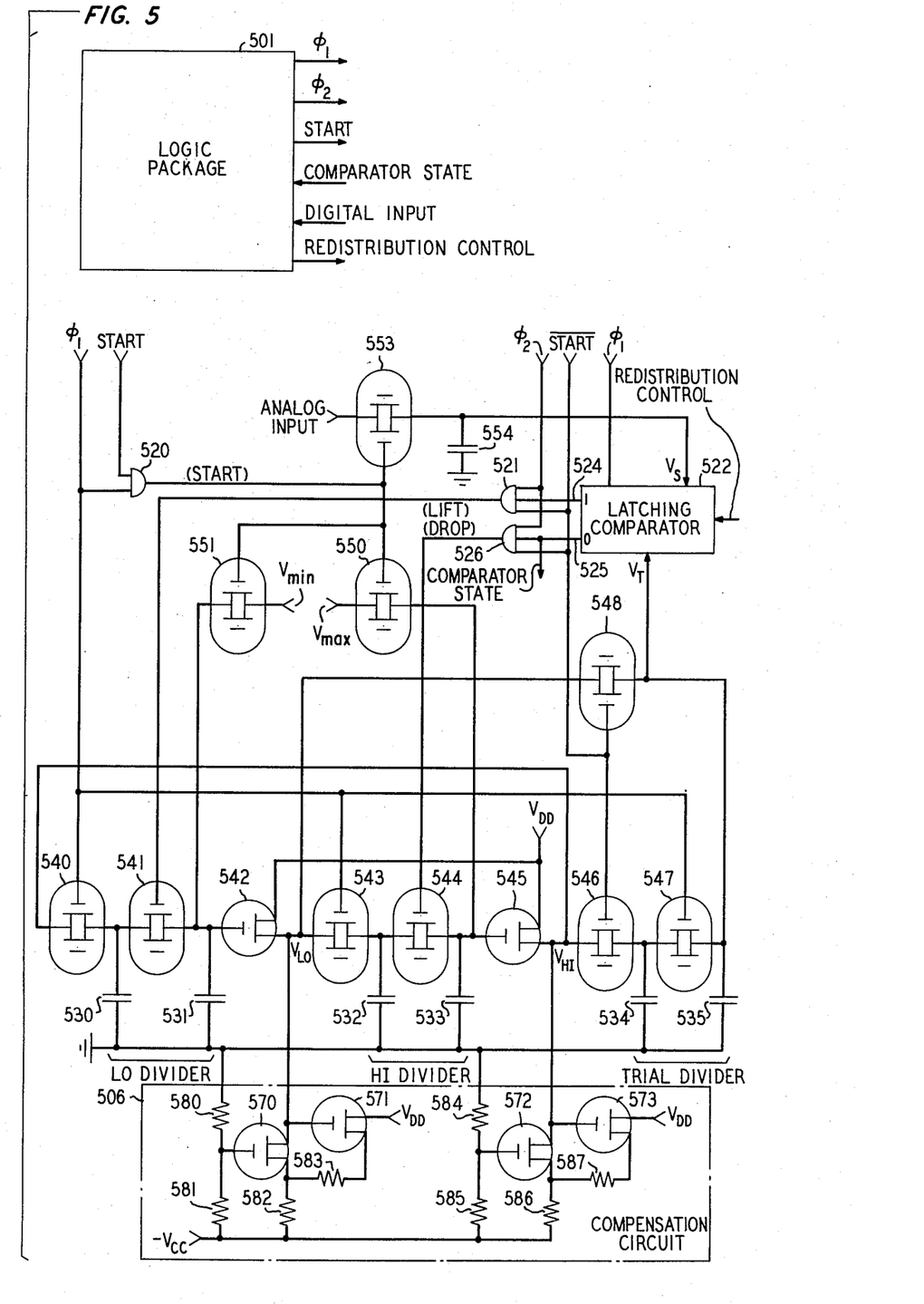
FIG. 5 shows a third illustrative embodiment of the invention and is called a Crossed-Dividers Codec.

FIG. 5 presents a novel Codec within the scope of the invention. It provides greater detail with regard to switch construction and to operation in the FET technology. A logic package similar to that shown in the preceding Figures is used and described in terms of the waveforms (shown by FIG. 6) that are generated. The Codec avoids the need for interaction between a comparator and a constant current generator in the storage of voltages such as was required in FIG. 3 and reduces the three buffer amplifiers of FIG. 4 to two FET source followers. An additional requirement however is the need for three pairs of precision capacitors in the coding operation and two pairs of precision capacitors are required for decoding. Note that FETs 542 and 545 are source followers utilizing constant current source loads comprising FETs 570 and 572.

Source followers do not normally have the desirable properties of unity gain and zero offset; but, in the instant invention these deficiencies are remedied by compensation circuit 506 which holds the gain and offset of the source followers to the required accuracy. Indeed, these compensated source followers are capable of providing excess compensation to remedy offset variation in the FET transmission gates.

FETs 542, 545 and 570-573 are ion implanted devices and thereby avoid problems associated with zero offset operation. FET 570, biased by resistors 580 and 581, supplies a constant current to FET 542. This quiescent current level is modified by feedback through FET 571 and resistors 582 and 583 to provide exactly zero offset and unity gain.

Figure 6:
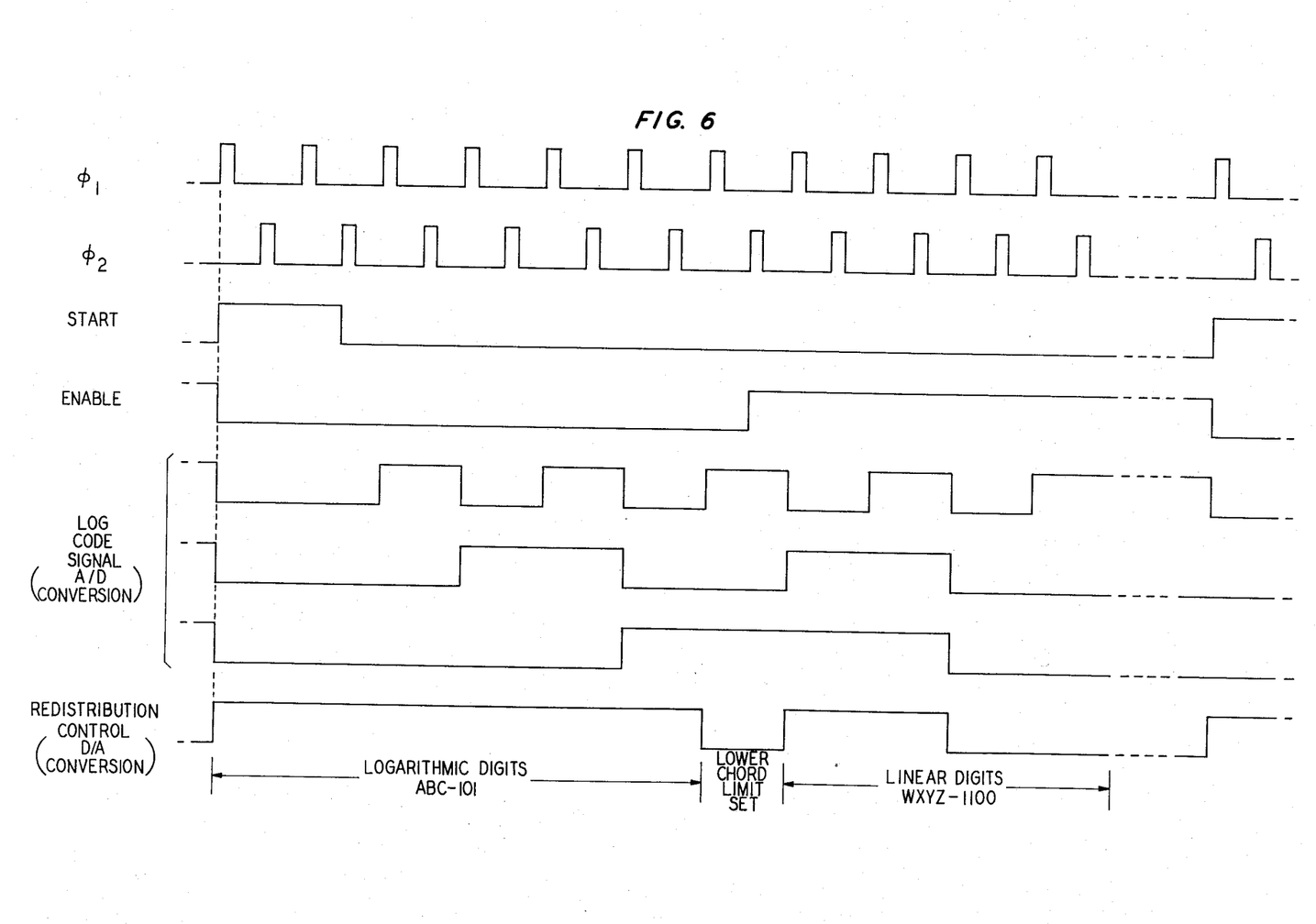
FIG. 6 is a timing diagram showing certain waveforms associated with the various Codecs.

Logarithmic coding begins when logic package 501 delivers a start pulse such as shown in FIG. 6. Start gate 520 being responsive to both the $\phi_1$ pulse and the START signal briefly closes switches 550, 551 and 553. Switch 553 causes the analog signal (assumed to be positive) to be sampled and thereafter stored on capacitor 554. Switches 550 and 551 are briefly closed to transfer $V_{max}$ and $V_{min}$ onto capacitors 533 and 531 respectively. During the same time interval the $\phi_1$ clock signal briefly closes switches 543 and 540 which effectively transfers $V_{min}$ (now $V_{LO}$) to capacitor 532 and transfers $V_{max}$ (now $V_{HI}$) to capacitor 530.

The first $\phi_2$ clock pulse is precluded from affecting gates 521 and 526 by the $\overline{\text{START}}$ signal, therefore the only activity initiated by this pulse is the transfer of $V_{HI}$ and $V_{LO}$ onto capacitors 534 and 535 through switches 546 and 548 respectively. While the next $\phi_1$ pulse operates switches 540, 543 and 547 the only activity occurs with respect to switch 547 where trial divider capacitors 534 and 535 redistribute their charge to form trial voltage $$V_T = \frac{V_{HI} + V_{LO}}{2}.$$

Latching comparator 522 compares this trial voltage with analog sample voltage $V_S$ during the next phase 2 pulse. If $V_T < V_S$ gate 521 is activated to redistribute charge on a LO divider by the closure of switch 541. If $V_T > V_S$ gate 526 is activated to redistribute charge on the HI divider by the closure of switch 544. This operation is functionally equivalent to transferring trial voltage $V_T$ to a lower limit storage device (LO divider) or to an upper limit storage device (HI divider) based on the results of a comparison between the trial voltage and the analog voltage such as performed by the circuits of FIGS. 3 and 4.

The first time $V_T < V_S$ is generated as a decision, the trial value has fallen below the sample; so the chord range bounds are established and linear coding can be started. The 3-digit logarithmic code is merely a measure of the number of $\phi_1$ timing pulses between the end of the START signal and the time when the output of gate 526 goes to the logic 1 state. A logarithmic code generator whose waveforms are shown by FIG. 6 is shown in FIG. 7.

Linear coding is merely the continuation of the same procedure but instead of using a logarithmic code generator to count the number of $\phi_1$ clock pulses, the output of latching comparator 522 is transmitted directly.

Figure 8:
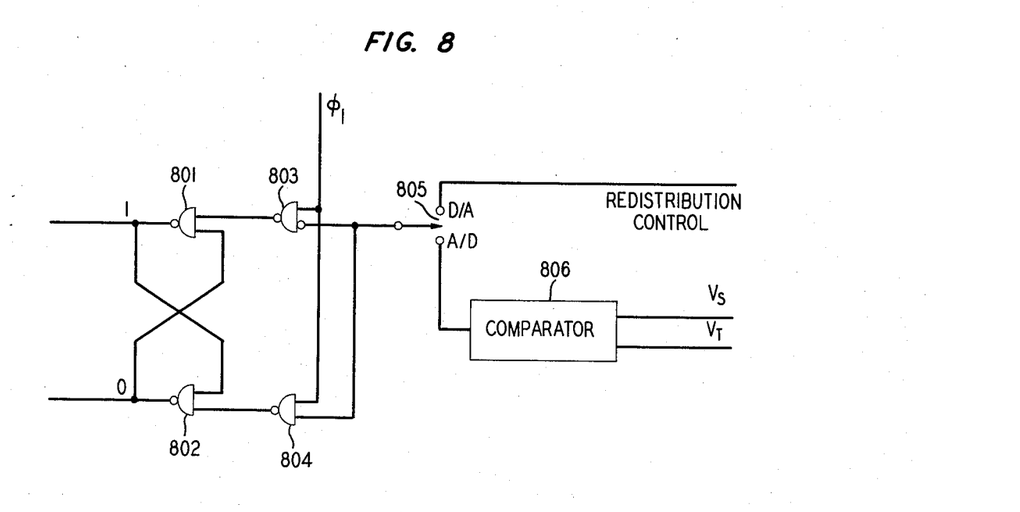
FIG. 8 shows a latching comparator circuit such as used in conjunction with the Codec shown in FIG. 5.

Latching comparator 522 functions to indicate the condition $V_T < V_S$ when output 524 is a logic 1, and the condition $V_T > V_S$ when output 525 is a logic 1. Latching is provided by allowing the output to change only when, for example, the $\phi_1$ pulse is a logic 1. FIG. 8 more fully illustrates the operation of such a circuit.

In FIG. 8, gates 801 and 802 form an RS flip-flop whose states are set by gates 803 and 804 when enabled by the $\phi_1$ clock. Switch 805 renders gates 801-804 responsive to states of comparator 806 during A/D conversion and responsive to states of the redistribution control signal during D/A conversion. Switch 805 merely represents a specific connection during the different conversion modes. The output of comparator 806 is arranged to be a logic 1 when $V_T > V_S$.

D/A conversion is a simpler operation than the above-described A/D conversion. The circuit of FIG. 5 no longer requires trial divider capacitors 534 and 535, switches 546, 547 and 548, sample gate 553 or sample capacitor 554. FIG. 8 is also simplified by the removal of comparator 806. A digital input signal containing synchronizing, polarity, logarithmic and linear information is delivered to logic package 501. The synchronizing information is used in generating the START signal which defines the beginning of a frame. The logarithmic digits, as before, define the number of binary voltage divisions needed to set the upper limit of the chord range. Logic package 501 converts the logarithmic digits into a first portion of a redistribution control signal (i.e., log code 101 becomes redistribution control signal 11111). Logarithmic package 501 then delivers a logic 0 followed by the four linear digits to form the second and third portions of the redistribution control signal.

When the START signal is received, capacitors 533 and 531 are charged to $V_{max}$ and $V_{min}$ through the operation of gate 520 and switches 550 and 551. The example redistribution control signal, shown in FIG. 6, is a logic 1 for the first five of the $\phi_2$ clock pulses following the termination of the START signal. Output lead 525 of comparator 522 is therefore a logic 1 for this interval. Accordingly gate 526 delivers pulses to switch 544 during the $\phi_2$ pulses and switch 543 discharges capacitor 532 to $V_{min}$ during $\phi_1$ pulses. This continues for a total of five $\phi_2$ pulses to thereby set $V_{HI}$ to the upper chord limit. The lower chord limit is established by the next $\phi_2$ clock pulse which briefly closes switch 541.

The four linear digits are decoded in accordance with a procedure that requires the closure of switch 541 whenever the redistribution control signal is a logic 0 and closure of switch 544 whenever the signal is a logic 1. When the redistribution control signal is a logic 1, a LIFT pulse is delivered by gate 521 to close switch 541 and divide the remaining range in half; capacitor 532 is pulled up to this middle value during the next $\phi_1$ pulse. The lower half of the linear range is thus discarded. When the redistribution control bit is a logic 0, a DROP pulse through gate 526 causes the closure of switch 544 to divide the sum of the capacitor 532 and 533 voltages which drops the upper level of the remaining chord range in half; capacitor 530 is lowered to this middle value during the next $\phi_1$ pulse. This process continues for a total of four times during linear decoding with the resultant analog voltage always residing between the converging upper and lower limits.

IV. FLIP-FLOP CAPACITIVE EXCHANGE CODEC

Figure 9:
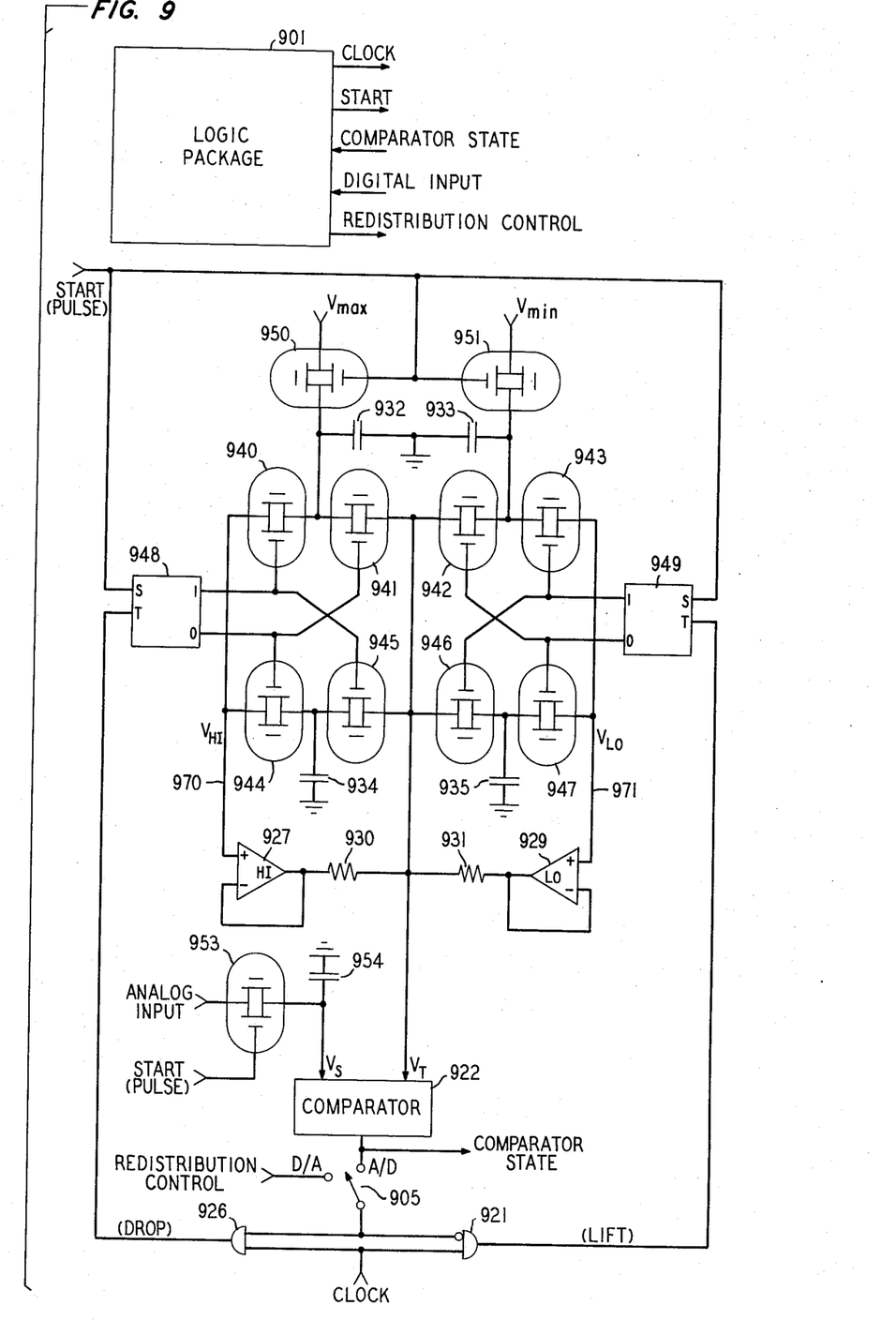
FIG. 9 shows a fourth illustrative embodiment of the invention and is called a Flip-Flop Capacitive Exchange Codec.

FIG. 9 illustrates yet another novel embodiment of the invention wherein a pair of resistors (930, 931) are the only precision components. Buffers 927 and 929 are unity gain zero offset amplifiers having relatively high input impedance and relatively low output impedance. The START pulse is not the same as was shown in FIG. 6; rather its duration is only long enough to allow capacitors 932, 933 and 954 to become charged. The capacitors can be of any value sufficient to hold a charge through a coding or decoding cycle. A single phase clock is used which results in faster operation than comparable circuits having a two phase clock.

A/D conversion proceeds when the START pulse briefly closes switches 950, 951 and 953. Switches 950 and 951 deliver $V_{max}$ and $V_{min}$ to storage capacitors 932 and 933 respectively. Switch 953 causes analog sample ($V_S$) to be delivered to capacitor 954 for later comparison with a sequence of changing trial voltages ($V_T$). Comparator 922 indicates that $V_T > V_S$ when its output is in the logic 1 state. Flip-flops 948 and 949 each control access to two storage capacitors. For example, when flip-flop 948 is in the set state capacitor 932 holds the existing upper limit and capacitor 934 is being updated to store the trial voltage level. When flip-flop 948 is in the reset state capacitor 934 holds the existing upper limit and capacitor 932 is being updated to store the trial voltage level. Flip-flop 948 changes state when a clock pulse occurs during a time that the output of comparator 922 indicates that $V_T > V_S$ and consequently the upper limit voltage is dropped from its existing voltage level to the trial voltage level which represents the average of the existing upper and lower limit voltages. Flip-flop 949 functions similar to flip-flop 948 but controls the lower limit voltage.

We therefore have a plurality of nonfixed storage locations holding the upper limit voltage, the lower limit voltage and the trial voltage. When, for example, an input signal indicates that the upper limit is to be lowered, means are provided to interchange the upper limit storage location and the trial voltage storage location; thereby lowering the upper limit voltage to the level of the prior trial voltage. Similarly, when the lower limit is to be raised, means are provided to interchange the lower limit storage location and the trial voltage storage location; thereby raising the lower limit voltage to the level of the prior trial voltage. A new trial voltage is consequently generated in the former upper or lower limit storage location and its level is equal to the average of the present upper and lower limit voltages.

Logarithmic coding is achieved by counting the number of clock pulses that occur after the start pulse has terminated but before the output of comparator 922 goes to the logic 0 state. In accordance with the logarithmic coding scheme of FIG. 1, a 3-digit binary code is generated to represent said number of clock pulses. Once the output of comparator 922 has become a logic 0 the upper and lower limits are ready for linear coding.

Assuming that both flip-flops are in the set state, the upper limit voltage ($V_{HI}$) resides on capacitor 932 and the lower limit voltage ($V_{LO}$) resides on capacitor 933. Switches 940, 943, 945 and 946 are closed. $V_{HI}$ is therefore fed through switch 940 into noninverting input lead 970 of amplifier 927 and $V_{LO}$ is fed through switch 943 into noninverting input lead 971 of amplifier 929. Resistors 930 and 931 are equal in value and arranged to generate voltage $$V_T = \frac{V_{HI} + V_{LO}}{2}.$$

$V_T$ is fed through closed switches 945 and 946 onto capacitors 934 and 935. When $V_T > V_S$ the output of comparator 922 is fed into gate 926 as a logic 1. The next occurrence of a clock pulse will therefore toggle flip-flop 948 into the reset state thereby opening switches 940 and 945 and closing switches 941 and 944. The output characteristic of flip-flop 948 (and 949) must preclude the possibility, even for a brief interval, of a simultaneous closure of all driven switches. Capacitor 934 now delivers the upper limit voltage to noninverting input 970 of amplifier 927 and $V_T$ is connected through switch 941 to capacitor 932. The value of $V_T$ will immediately decrease to a new level determined by the previous value of $V_T$ and the previous lower limit voltage. The clock pulse must be of short enough duration to be gone before the output of comparator 922 can change state in response to the new level of $V_T$; otherwise, a possible state change would toggle flip-flop 949 prematurely.

In the D/A conversion process logic package 901 is responsive to a digital input signal such as described in connection with FIG. 5 for synchronizing the clock rate and generating the redistribution control signal shown in FIG. 6. Switch 905 is connected to the D/A input causing gates 921 and 926 to be responsive to states of the redistribution control signal in conjunction with clock pulses to toggle flip-flops 948 and 949 in a manner identical to the A/D conversion process. The value of voltage $V_T$, at the end of each decoding cycle, is the analog voltage equivalent of the digital input signal.

Although specific embodiments of this invention have been shown and described, it will be understood that various modifications may be made without departing from the spirit of this invention.

What is claimed is:

1. A signal generator characterized by:
   means for storing upper and lower limit voltages that are initially set to predetermined maximum and minimum levels respectively;
   means for averaging the stored upper and lower limit voltages to form a trial voltage;
   means for lowering the magnitude of the stored upper limit voltage to the level of the trial voltage in response to one state of a binary signal to form a new upper limit voltage;
   means for raising the magnitude of the stored lower limit voltage to the level of the trial voltage in response to an other state of the binary signal to form a new lower limit voltage; and
   means for averaging the magnitude of the new upper limit voltage with the magnitude of the new lower limit voltage to form a new trial voltage.

2. A signal generator according to claim 1 further including means for comparing the magnitude of the trial voltage with the magnitude of a selected one of the limit voltages, and further including a constant current generator responsive to said comparing means for adjusting the magnitude of the selected one of the limit voltages, said selections being made in accordance with states of the binary signal.

3. A signal generator according to claim 1 further including a pair of buffer amplifiers having substantially unity gain, zero offset and relatively high input impedance for delivering said limit voltages to the averaging means whereby the magnitudes of said limit voltages are rendered unchanged when the averaging means forms the trial voltage.

4. A signal generator according to claim 1 wherein said averaging means includes a pair of capacitors, whose capacitance values are substantially equal, for storing the upper and lower limit voltages and means interconnecting said capacitors for transferring electronic charge therebetween.

5. A signal generator according to claim 1 wherein the binary signal comprises the binary outcome of a comparison between the trial voltage and an input voltage; said one state being the outcome that the trial voltage is greater than the input voltage, said other state being the outcome that the trial voltage is less than the input voltage; whereby analog to digital conversion is performed.

6. A signal generator according to claim 1 wherein the binary signal comprises a plurality of predetermined binary states; whereby digital to analog conversion is performed.

7. A signal generator according to claim 3 wherein said pair of buffer amplifiers comprise field effect transistors, each having source, drain and gate terminals and operating as a source follower with battery current supplied to the drain terminal at a rate determined by a constant current generator in the source circuit, said rate being adjustably capable of providing zero offset voltage between the input gate terminal and the output source terminal.

8. In a converter for interchanging analog and digital voltages:
   means for storing an upper limit voltage and a lower limit voltage, said limit voltages being initially set to predetermined maximum and minimum levels respectively;
   means for averaging said upper and lower limit voltages to form a trial voltage;
   means for storing said trial voltage;
   means responsive to one state of a binary signal for averaging the upper limit voltage and the trial voltage to form a new upper limit voltage;
   means responsive to an other state of the binary signal for averaging the lower limit voltage and the trial voltage to form a new lower limit voltage; and
   means for averaging the new upper and new lower limit voltages to form a new trial voltage.

9. A converter according to claim 8 wherein the averaging means includes means for electrically interconnecting said selected voltages to thereby form said new trial voltage.

10. A converter according to claim 9 wherein the interconnecting means includes a pair of resistors whose resistive values are substantially equal.

11. In a digital-to-analog converter wherein a binary signal is converted into a voltage level, said binary signal including logarithmic encoded information for locating a voltage range plus linear encoded information for locating the voltage level within said voltage range, wherein the voltage level has a magnitude residing between an upper and lower limit voltage initially set to predetermined maximum and minimum levels respectively,
   means for storing the upper limit voltage and the lower limit voltage;
   means for averaging the magnitudes of said stored upper and lower limit voltages to form a trial voltage;
   means responsive to one state of the binary signal for lowering the magnitude of the stored upper limit voltage to the magnitude of the trial voltage to form a new upper limit voltage and responsive to an other state of the binary signal for raising the magnitude of the stored lower limit voltage to the magnitude of the trial voltage to form a new lower limit voltage;
   means for averaging the magnitude of the new upper limit voltage with the magnitude of the new lower limit voltage to form a new trial voltage; and
   means for converting said logarithmic encoded information into a plurality of binary digits of said one state for successively lowering the magnitude of the upper limit voltage.

12. In an analog-to-digital converter for converting a voltage level into a binary signal wherein the voltage level has a magnitude residing between an upper and a lower limit voltage initially set to predetermined maximum and minimum levels respectively characterized by:
   means for storing the upper limit voltage and the lower limit voltage;
   means for averaging the magnitudes of the stored upper and lower limit voltages to form a trial voltage;
   means for periodically comparing the magnitude of said voltage level with the magnitude of the trial voltage to generate a binary signal in accordance with the outcome of the comparison;
   means responsive to one state of the binary signal for lowering the magnitude of the stored upper limit voltage to the magnitude of the trial voltage to form a new upper limit voltage;

means responsive to an other state of the binary signal for raising the magnitude of the stored lower limit voltage to the magnitude of the trial voltage to form a new lower limit voltage;

means for averaging the magnitude of the new upper limit voltage with the magnitude of the new lower limit voltage to form a new trial voltage;

means for recording the number of times the upper limit voltage is lowered before the lower limit voltage is first raised; and means for encoding said recorded number as a binary count, said binary count being designated as a logarithmic code signal.

13. In an analog-to-digital converter according to claim 12 further including means for storing the logarithmic code signal; and means for ordering the transmission sequence of said logarithmic code signal and the sequence of the binary states formed subsequent to the time when the lower limit voltage was first raised, said subsequent states being designated as a linear code signal.

* * * * *